United States Patent
Su

(10) Patent No.: US 9,793,386 B2
(45) Date of Patent: Oct. 17, 2017

(54) MULTIPLE ZONE POWER SEMICONDUCTOR DEVICE

(71) Applicant: FORD GLOBAL TECHNOLOGIES, LLC, Dearborn, MI (US)

(72) Inventor: Ming Su, Canton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 83 days.

(21) Appl. No.: 14/883,110

(22) Filed: Oct. 14, 2015

(65) Prior Publication Data

US 2017/0110561 A1  Apr. 20, 2017

(51) Int. Cl.
| | | |
|---|---|---|
| *H01L 29/66* | (2006.01) | |
| *H01L 29/739* | (2006.01) | |
| *H01L 29/06* | (2006.01) | |
| *H01L 29/10* | (2006.01) | |
| *H01L 27/082* | (2006.01) | |

(52) U.S. Cl.
CPC ........ *H01L 29/7397* (2013.01); *H01L 27/082* (2013.01); *H01L 29/0696* (2013.01); *H01L 29/1095* (2013.01); *H01L 29/7395* (2013.01)

(58) Field of Classification Search
CPC ............. H01L 29/7397; H01L 29/0696; H01L 29/1095
See application file for complete search history.

(56) References Cited

U.S. PATENT DOCUMENTS

| | | | | |
|---|---|---|---|---|
| 5,861,638 A | * | 1/1999 | Oh ...................... | H01L 29/7395 257/133 |
| 9,184,667 B2 | * | 11/2015 | Shi ................... | H02M 3/33523 |
| 2002/0020873 A1 | | 2/2002 | Klodzinski | |
| 2009/0289690 A1 | * | 11/2009 | Hirler ................. | H01L 29/4236 327/429 |
| 2012/0307540 A1 | * | 12/2012 | Tagome ............... | H02M 1/088 363/131 |
| 2013/0062958 A1 | * | 3/2013 | Erickson, Jr. ....... | H02M 3/1582 307/82 |
| 2014/0065778 A1 | | 3/2014 | Sdrulla et al. | |
| 2015/0060938 A1 | * | 3/2015 | Lu ......................... | H01L 29/404 257/139 |
| 2015/0091051 A1 | * | 4/2015 | Laven ................. | H01L 29/7397 257/139 |
| 2015/0200247 A1 | * | 7/2015 | Schmidt ........... | H01L 29/66348 257/140 |
| 2016/0191046 A1 | * | 6/2016 | Zhao .................... | H03K 17/567 327/432 |
| 2016/0226479 A1 | * | 8/2016 | Xu ........................ | H03K 17/56 |
| 2016/0336394 A1 | * | 11/2016 | Hu ..................... | H01L 29/0623 |
| 2016/0352211 A1 | * | 12/2016 | Kameyama .......... | H01L 29/063 |

* cited by examiner

*Primary Examiner* — Victor A Mandala
(74) *Attorney, Agent, or Firm* — David Kelley; Brooks Kushman P.C.

(57) ABSTRACT

A power semiconductor device is comprised of a plurality of zones having similar structure. Each of the zones may be characterized by a switching loss during transitions to a non-conducting state. The device is configured such that the switching loss is different between at least two of the zones. Further, the device is configured such that zones having greater switching losses transition to the non-conducting state before zones having lesser switching losses.

20 Claims, 3 Drawing Sheets

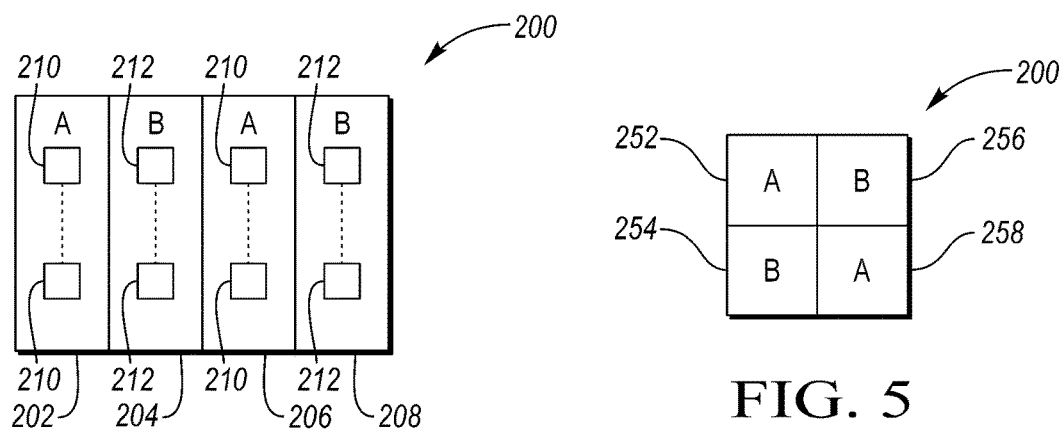
FIG. 4
FIG. 5
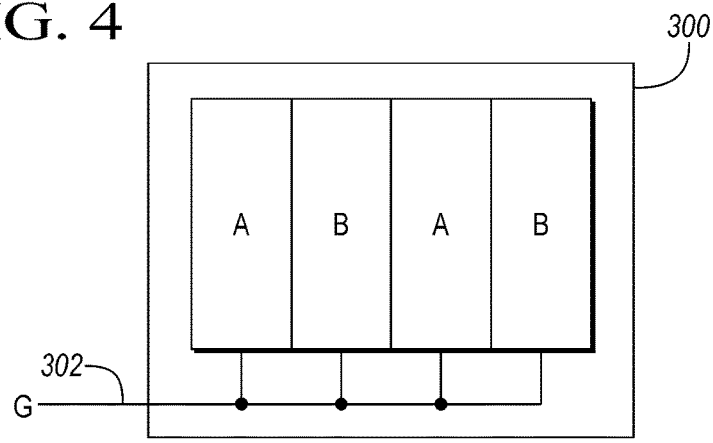
FIG. 6
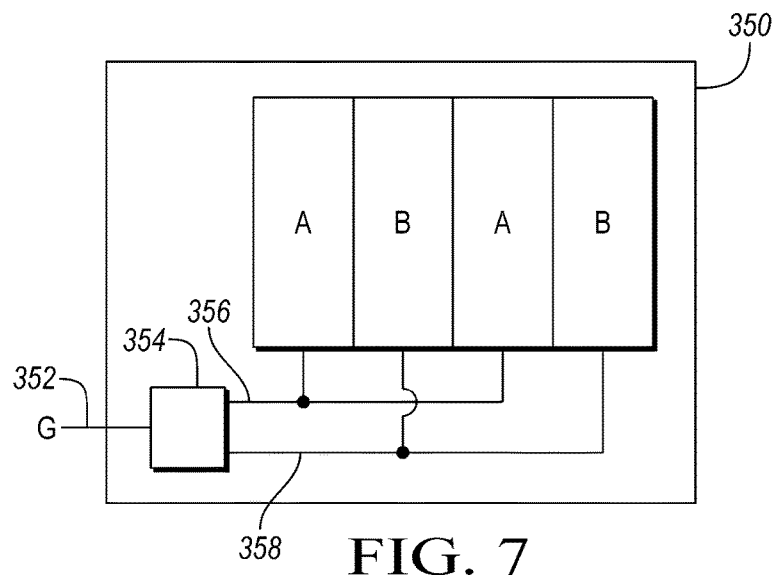
FIG. 7

MULTIPLE ZONE POWER SEMICONDUCTOR DEVICE

TECHNICAL FIELD

This application generally relates to power semiconductor devices.

BACKGROUND

Power semiconductor devices, especially bipolar types utilizing minority carrier conduction, are designed according to trade-off curves between conduction loss and switching loss. Products targeting high frequency switching normally optimize the switching loss performance with relatively high on-state conduction voltage. Products targeting low frequency switching normally optimize the conduction loss performance with relatively high switching loss. Existing designs do not allow a switching transistor to achieve a low-loss conduction state and a low-loss switching behavior in the same chip, for a given technology capacity.

SUMMARY

In some configurations, an insulated gate bipolar transistor includes first and second zones each including a plurality of gate regions adjacent an emitter region and extending through a base region into a drift region that is disposed on a collector region, the first zone being configured to (i) have a switching loss greater than the second zone during transitions to a non-conducting state, and (ii) transition to the non-conducting state before the second zone. Other configurations may include corresponding computer systems, apparatus, and computer programs recorded on one or more computer storage devices, each configured to perform the actions of the methods.

Some configurations may include one or more of the following features. The insulated gate bipolar transistor in which the collector region of the first zone has a doping density that is greater than that of the second zone. The insulated gate bipolar transistor in which the drift region of the first zone has more stored charges during a conducting state than the drift region of the second zone due to different recombination lifetime killing treatment between the first zone and the second zone. The insulated gate bipolar transistor in which the gate regions are electrically connected to a common gate signal. The insulated gate bipolar transistor in which a gate oxide layer separates the gate regions from adjacent regions and a thickness of the gate oxide layer of the first zone is greater than that of the second zone. The insulated gate bipolar transistor in which the base region of the first zone has a doping density that is greater than that of the second zone. The insulated gate bipolar transistor in which the first zone and the second zone are further configured such that the first zone receives a request to transition to the non-conducting state before the second zone receives the request. The insulated gate bipolar transistor in which the gate regions of the second zone are connected to a gate signal having a predetermined resistance value that lowers a discharging current level from gate capacitance of the second zone, and in which the predetermined resistance value is greater than a resistance value associated with gate regions of the first zone. Implementation of the described configurations may include hardware, a method or process, or computer software on a computer-accessible medium.

In some configurations, a power semiconductor device includes a plurality of zones configured such that at least two of the zones have different switching losses during transitions to a non-conducting state and such that, for any two of the zones, the zone of the two having a greater switching loss transitions to the non-conducting state before the other of the two. Other configurations may include corresponding computer systems, apparatus, and computer programs recorded on one or more computer storage devices, each configured to perform the actions of the methods.

Some configurations may include one or more of the following features. The power semiconductor device in which the at least two of the zones have different doping densities in at least one predetermined layer. The power semiconductor device in which the at least one predetermined layer is a collector region. The power semiconductor device in which the at least two of the zones have different thickness in at least one predetermined layer. The power semiconductor device in which the at least one predetermined layer is a gate oxide layer between a gate region and a base region. The power semiconductor device in which the at least two of the zones are further configured such that the zone of the two having the greater switching loss receives a request to transition to the non-conducting state before the other of the two. Implementation of the described configurations may include hardware, a method or process, or computer software on a computer-accessible medium.

In some configurations, an insulated gate bipolar transistor includes a plurality of zones, each characterized by a switching loss during a transition to a non-conducting state, configured such that the switching loss is different between at least two of the zones and such that the zones having greater switching losses transition to the non-conducting state before the zones having lesser switching losses. Other configurations may include corresponding computer systems, apparatus, and computer programs recorded on one or more computer storage devices, each configured to perform the actions of the methods.

Some configurations may include one or more of the following features. The insulated gate bipolar transistor in which the at least two of the zones have different doping densities in at least one region. The insulated gate bipolar transistor in which the at least one region is a collector region. The insulated gate bipolar transistor in which the at least two of the zones have different thickness in at least one region. The insulated gate bipolar transistor in which the at least one region is a gate oxide layer. The insulated gate bipolar transistor in which at least two of the zones are further configured such that the zones having lower switching losses receive a request to transition to the non-conducting state after the zones having greater switching losses. Implementation of the described configurations may include hardware, a method or process, or computer software on a computer-accessible medium.

BRIEF DESCRIPTION OF THE DRAWINGS

FIG. 4 depicts a possible IGBT configuration utilizing two distinct zone configurations arranged in a row.

FIG. 5 depicts a possible IGBT configuration utilizing two distinct zone configurations arranged in a grid.

FIG. 6 depicts a possible IGBT configuration in which gate regions are driven by a common gate signal.

FIG. 7 depicts a possible IGBT configuration in which gate regions for each of the zones are driven by separate gate signals within the device.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Power semiconductor devices, especially bipolar types utilizing minority carrier conduction, are designed according to trade-off curves between conduction loss and switching loss. Products targeting high frequency switching normally optimize the switching loss performance with relatively high on-state conduction voltage and vice versa.

An Insulated Gate Bipolar Transistor (IGBT) is a solid-state switching device that finds use in many applications. For example, an IGBT may be used in power inverters for controlling electric machines. The power inverter may be used to convert a high-voltage direct current (DC) battery output to an alternating current (AC) signal for the electric machines. During operation, the IGBT may experience energy losses due to the characteristics of the device. These energy losses may be converted to heat in the IGBT and surrounding environment. The energy losses may be observed as voltage drops across the IGBT. Conduction losses may be those losses that occur when the IGBT is switched on and conducting current. Switching losses may be those losses that occur when the IGBT is being switched on and/or off.

Figure 1:
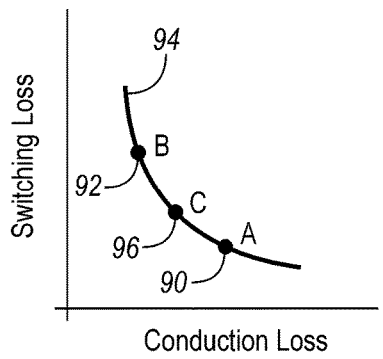
FIG. 1 is a graph depicting design tradeoffs between switching losses and conducting losses for an IGBT.

A typical IGBT is designed to have a certain relationship between switching losses and conduction losses. Generally, as switching losses are reduced, the conduction losses are increased. During the switching process, particularly turn-off transients, IGBTs designed for low-frequency switching may normally incur high switching losses due to excessive tail current that occurs simultaneously with high voltage across the IGBT. General IGBT designs choose a configuration that provides a desired trade off. FIG. 1 depicts a curve 94 showing the trade-off between conduction losses and switching losses for the IGBT. An IGBT configured for performance at a first point A 90, may be configured for low switching losses. An IGBT configured for performance at a second point B 92 may be configured for low conduction losses. An IGBT configured for performance at a third point C 96 may be configured to have conduction loss and switching loss properties between those of point A 90 and point B 92. It is observed that reducing one of the conduction losses or the switching losses results in an increase in the other.

An IGBT may have three terminals that are coupled to an external circuit. The three terminals are a gate, a collector, and an emitter. Power semiconductors may be comprised of different layers of materials. A material is referred to as a p-type material when it has a deficiency of negative charge. That is, there are spaces or holes available for electrons to fill. A material is referred to as an n-type material when it has a negative charge. That is, there are free electrons available in the material. Certain materials, such as silicon, may be transformed into a p-type or n-type material by a process called doping. To form p-type material, the silicon may be doped with elements having one less outer shell electron (e.g., boron, gallium). To form an n-type material, the silicon may be doped with elements having one more outer shell electron (e.g., arsenic, phosphorous). To indicate the level of doping, a plus or minus superscript is used in conjunction with the type of material. For example, $p^+$ and $n^+$ materials are heavily doped and $p^-$ and $n^-$ materials are lightly doped.

Figure 2:
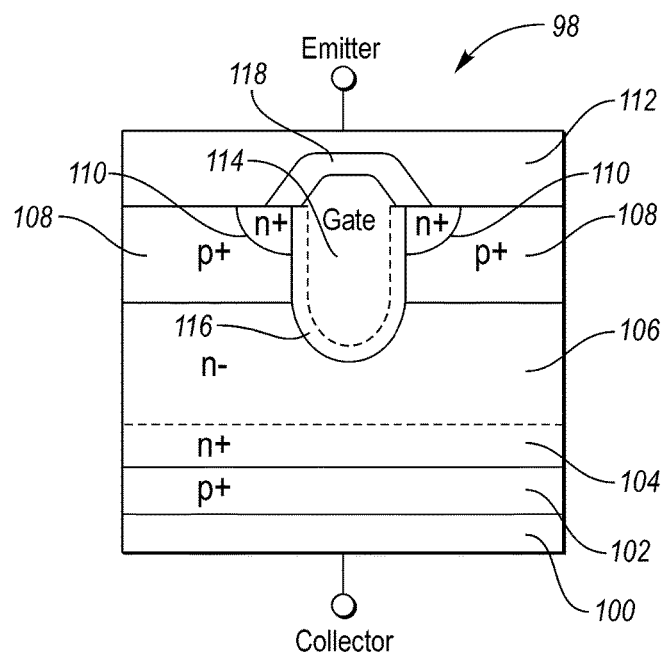
FIG. 2 is an example cross-section of a trench-type IGBT.

FIG. 2 depicts a cross-sectional view of a possible configuration for a trench-type IGBT section 98. An IGBT may be comprised of a plurality of such sections 98. The IGBT may include a collector contact 100. The collector contact 100 of each of the sections may be electrically connected to the collector terminal. A collector region 102 may be disposed adjacent the collector contact 100. The collector region 102 may be formed of a p+-type material. A drift region 106 may be disposed adjacent the collector region 102. The drift region 106 may be formed of an $n^-$-type material. The drift region 106 may include a buffer region 104 disposed adjacent the collector region 102. The buffer region 104 may be formed of an n+-type material. A base region 108 may be disposed adjacent the drift region 106. The base region 108 may be formed of a p+-type material. An emitter contact 112 may be disposed adjacent the base region 108. The emitter contact 112 of each of the sections may be electrically connected to the emitter terminal. The emitter contact 112 and the collector contact 100 may be a conductive material having low resistivity.

A gate region 114 may extend through the base region 108 and into the drift region 106. This configuration may be referred to as a trench-type IGBT. A cross-section of the gate region 114 may appear to form a trench through the base region 108 and the drift region 106. The gate region 114 may be formed of a conductive material having low resistivity. An insulating region 118 may be disposed between the gate region 114 and the emitter contact 112. The insulating region 118 may be formed of a material of high resistivity to electrically isolate the gate region 114 from the emitter contact 112. The gate region 114 may include a gate insulation layer 116 that isolates the gate region 114 from adjacent regions. An emitter region 110 may be formed within the base region 108 between the gate insulation layer 116 and the emitter contact 112. The emitter region 110 may be formed of an $n^+$-type material. The emitter contact 112 may be electrically connected to the emitter region 110 and the base region 108.

Figure 3:
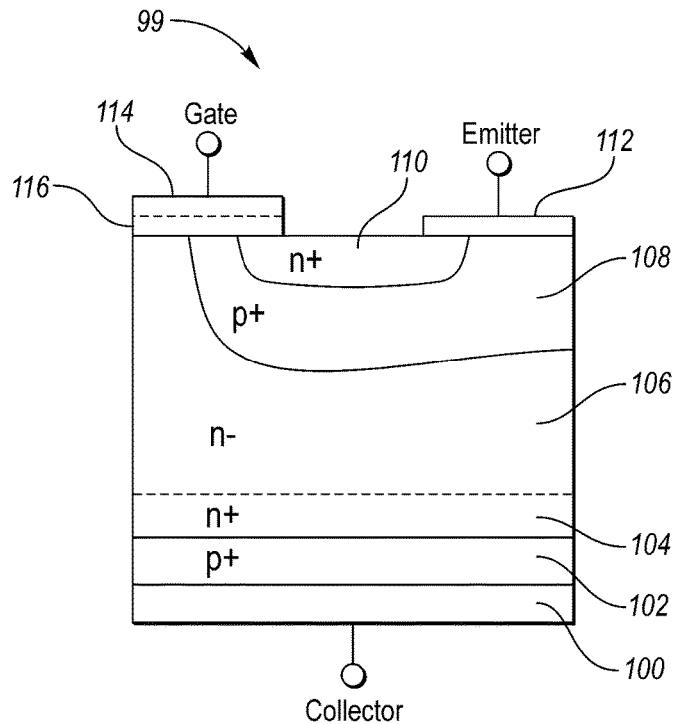
FIG. 3 is an example cross-section of a planar-type IGBT.

FIG. 3 depicts a cross-sectional view of a configuration for a planar-type IGBT section 99. Note that the regions may be similar to those defined for the trench-type IGBT. The planar-type IGBT section 99 may include the collector contact 100. The collector region 102 may be disposed adjacent the collector contact 100. The collector region 102 may be formed of a p+-type material. The drift region 106 may be disposed adjacent the collector region 102. The drift region 106 may be formed of an $n^-$-type material. The drift region 106 may be further coupled to the gate region 114. The drift region 106 may include the buffer region 104 that is disposed adjacent the collector region 102. The buffer region 104 may be formed of an n+-type material. The base region 108 may be disposed adjacent the drift region 106 and between the gate region 114 and the emitter contact 112. The base region 108 may be formed of a p+-type material. The emitter region 110 may be disposed adjacent the base region 108 and between the gate region 114 and the emitter contact 112. The emitter region 110 may be formed of an n$^+$-type material. The emitter contact 112 of each of the sections may be electrically connected to the emitter terminal. The emitter contact 112 and the collector contact 100 may be a conductive material having low resistivity. The gate region 114 may be formed of a conductive material having low resistivity. The gate region 114 may include the gate insulation layer 116 that isolates the gate region 114 from adjacent regions.

The IGBT may be constructed of the planar-type structure 99 or the trench-type structure 98. Operation of the IGBT for either construction is similar. The techniques to be described apply to either configuration without limitation. The structures depicted are cross-sections of a portion of an IGBT. A practical IGBT may include a plurality of such structures constructed on a single device. A typical IGBT may include a number of such structures having the same materials and doping concentrations. Additional structures may allow for higher current carrying capacity. The additional structures may be placed in rows and/or may form a grid. In general, the emitter contact 112, the collector contact 100 and the gate region 114 of each of the sections may be electrically coupled such that the integrated device has a single emitter terminal, a single collector terminal, and a single gate terminal.

In some applications, the IGBT may be used as a switch to control current flow through an electrical load. For example, in an inverter application, the collector may be electrically connected to an output of a high-voltage battery. The emitter may be electrically connected to an electric machine. During operation of the inverter, when the IGBT is in the non-conducting state, the voltage across the collector and emitter terminals may be a high voltage.

The gate terminal may be electrically connected to control circuitry or an output of a controller. Current flow between the collector terminal and the emitter terminal may be controlled by operation of the gate terminal. The controller may control the IGBT by outputting a voltage (gate voltage) across the gate terminal and the emitter terminal. When the gate voltage is greater than a threshold level and the collector to emitter voltage is positive, current may flow between the collector and emitter. When the gate voltage is less than the threshold level, current flow between the collector and emitter may be blocked. When there is no gate voltage applied the device may be in a blocking or non-conducting state. In the non-conducting state, current flow is prevented between the collector terminal and the emitter terminal.

The emitter region 110, the base region 108 and the drift region 106 form a metal-oxide semiconductor field-effect transistor (MOSFET) that is controlled by the gate voltage. When the gate is positively biased with respect to the emitter, the resulting electric field creates a channel of negative charge in the base region 108 near the gate region 114. The channel of negative charge connects the emitter region 110 and the drift region 106. As the gate becomes more positively biased with respect to the emitter, current begins to flow between the collector and the emitter through the channel.

Conductivity of the drift region 106 may be modulated by the gate voltage. As the gate voltage increases, the conductivity of the drift region 106 increases, allowing a higher current to flow and decreasing the voltage drop between the collector and emitter. When the gate voltage is greater than a threshold, the IGBT may be in a conducting state (on-state) with a relatively small voltage drop between the collector and emitter. In the conducting state, current flows through the collector and the emitter when the collector to emitter voltage is positive.

Transition to the non-conducting state begins when the gate voltage drops below the threshold. However, the current does not cease flowing instantaneously. Stored charge in the drift region 106 may cause a tail current to continue flowing. During turn off, the collector to emitter voltage may increase while the current decreases. Stored charge in the drift region 106 may be reduced by recombination within the device. This affects the switching time and switching losses of the IGBT. In a high-voltage application, the collector to emitter voltage may rise to a high voltage. Power loss may be defined as a product of voltage and current. During this turn-off time, the power loss may rise rapidly as the voltage may increase rapidly.

An IGBT may be characterized by how it performs during switching operations. That is, during transitions from a conducting state to a non-conducting state. During the transition from the conducting state to the non-conducting state, energy losses may occur due to switching losses. The losses may be computed as a power loss that is a product of a voltage and a current. The voltage may be a collector-emitter saturation voltage ($V_{ce}$). The current may be a collector cutoff current ($L_{ces}$).

The switching losses include energy losses due to the tail current that is present during device switch off. When the IGBT is switched off by reducing the gate voltage, the collector-emitter voltage begins to increase. During this time, current is still flowing between the collector and emitter. The current decays toward zero during this time. However, during this time, energy is lost as the voltage and current are non-zero. By reducing the tail current, switching losses may be reduced.

The switching time and losses may be impacted by various design choices for the IGBT. Generally, modifications that decrease the switching losses cause an increase in the conduction losses. As such, there is a tradeoff in selecting between switching losses and conduction losses. It may be desirable to construct an IGBT having improved switching losses without the resulting increase in conduction losses. IGBT devices having lower switching losses may be suitable for high-frequency switching applications.

In a typical IGBT, all regions of the device are designed to have the same switching properties. However, the IGBT may be constructed such that various zones or regions of the IGBT have different properties. The IGBT may be comprised of a plurality of zones. Each zone may include an IGBT structure as described. However, the IGBT structure of each zone may be configured to have a different switching loss. A variety of techniques are available to change the switching losses of each of the zones. Further, the IGBT structure of each of the zones may be configured to switch off at a different time for each of the zone.

In some configurations, the doping density of the collector region 102 may be different for at least two of the zones. Switching losses may be affected by the doping density of the collector region 102. The different switching losses between the zones may be achieved by a different doping density of the p-type collector region 102 for each of the zones. Increasing the doping density in the collector region 102 increases the switching losses of that zone. For example, a low dose of boron may first be implanted in the collector region 102 of the entire IGBT. A high switching-loss zone may be created by a second implant of boron into predetermined zones of the IGBT. The zones that do not receive the second implant may have lower switching losses. This results in an IGBT having different collector region doping densities and, as a result, having different switching times and losses.

The turn off time may be impacted by the time needed to remove stored charges in the drift region 106 caused by injected minority carriers during the conducting state. In some IGBT configurations, addition of the more heavily doped buffer region 104 improves the removal of minority carriers during turn off, but increases the conduction losses in the conducting state. The switching time may be affected by constructing the IGBT with different recombination lifetime killing treatments in the buffer region 104 and/or the drift region 106. An increase in recombination lifetime killing treatments may result in lower switching losses. This process reduces the number of stored charges in the associated region. For example, electron irradiation may be applied in the IGBT to facilitate recombination when the device is turned off.

The low switching loss zones may be implemented by a selective area carrier recombination lifetime killing process, such as implanting Helium (He) or certain other ions from the bottom side of the chip. To prevent the implants from impacting the high switching loss zones, an implantation mask may be used. For example, a thick layer film of heavy metal may be deposited on the backside of the chip and patterned by lithography.

During transitions from the conducting state to the non-conducting state, the high switching loss zones and the low switching loss zones may behave differently. Zones configured as high switching loss zones may take a longer time to stop conducting current. The IGBT may be configured such that the high switching loss zones are commanded to turn off before the low switching loss zones.

Each of the zones may be configured to have a different gate threshold voltage. The gate threshold voltage may be configured by using a different gate insulation thickness for each of the zones. The resulting configuration may be such that the zones switch off at different times. During switch off, the load current may be carried by those zones having a lower gate threshold voltage. Those zones with a higher gate threshold voltage may carry reduced current density during the turn-off process. This leads to a reduction in the tail current losses as the gate channels are turned off earlier in the high switching loss zones. When the zones configured for low switching losses finally turn off, the tail loss is lower because these zones are configured to conduct current at a reduced level of conductivity modulation.

Adjusting the switch-off time may be achieved by a variety of techniques. Such a configuration may result in lower switching losses for the device. By turning off the high switching loss zones earlier, the high switching loss zones may begin the shut-off process sooner. As the low switching loss zones may still be active, the rate of increase of the collector-emitter voltage will be less. The result is that the switching losses will be reduced in the high switching loss zones. After a predetermined time or delay, the low switching loss zones may be switched off. As the low switching loss zones are already configured to reduce switching losses, the overall losses of the device may be reduced.

In some configurations, the different zones may be controlled by separate gate signals. The gate signal that controls the low switching loss zones may be delayed relative to the gate signals for the high switching loss zones. For example, an extra on-chip resistance that lowers the discharging current level from gate capacitance of the low switching loss zones may be used.

In some configurations, the different zones may be controlled by a common gate signal, but each of the zones may react differently to the common gate signal. A thickness of the gate insulation layer 116 may be different for each of the zones. A threshold voltage may increase as the gate insulation layer thickness increases. The gate threshold voltage is a voltage level at which current begins to flow in the collector. A higher gate threshold means that the collector current will begin to stop flowing at a higher voltage. The low switching loss zone may be configured with a thinner gate insulation layer 116 so that a lower gate threshold voltage is obtained to allow the low switching loss zone to switch off later.

A variety of methods may be available to adjust the gate insulation layer of each of the zones. In some configurations, the gate insulation layer 116 may be an oxide layer. In some configurations, the gate insulation layer 116 may be comprised of a non-oxide insulator, such as silicon nitride. When silicon dioxide is used as the gate insulation layer 116, zones configured to have thinner gate insulation layers may first be covered in a deposited silicon nitride film while the other zones go through gate oxide growth. The silicon nitride film may then be removed, followed by additional oxidation time to increase the oxide thickness in all zones. In some configurations, all of the zones may be thermally oxidized simultaneously. Zones configured to a thicker gate oxide layer may receive additional oxide film deposition by Chemical Vapor Deposition (CVD). In some configurations, all of the zones may be thermally oxidized simultaneously, but zones configured for a thinner gate insulation layer may receive selective-area plasma etching to reduce the oxide thickness.

In some configurations, the base region 108 of the low switching loss zones and the high switching loss zones may have different doping densities. To increase the gate threshold voltage, the doping density of the base region 108 may be increased for zone configured as high switching loss zones. For example, a first implantation dose may be applied to all of the zones. The high switching loss zones may then receive a second implantation dose using an implantation mask. The result is that the zones will be configured to turn off at slightly different times.

An IGBT may be comprised of a plurality of zones. Each zone may be comprised of a plurality of IGBT segments (e.g., 98 or 99) as depicted in FIG. 2 or FIG. 3. Each of the zones or subsets of the zones may be configured to have a different switching loss characteristic. Each of the zones or subsets of the zones may be configured to turn off at different times. For example, those zones having higher switching losses may be configured to turn off before zones having lower switching losses. A variety of configurations for such an IGBT are possible.

For simplicity, an IGBT configuration having two distinct zones, A and B, may be described. A first zone may have switching loss characteristics as described by point A 90 of FIG. 1. This point may be configured to have relatively low switching losses. A second zone may have switching loss characteristics as described by point B 92 of FIG. 1. This point may be configured to have relatively high switching losses. Further, the second zone may be configured to transition to the non-conducting state before the first zone by the methods described herein. In the example configurations to be described, zones labeled A and B may be used to describe performance of the first zone and second zone respectively. The terms high and low are used in a relative sense and do not necessarily imply that the losses are high or low in an absolute sense.

FIG. 4 depicts a first IGBT configuration 200 that includes four zones arranged in a row. A first IGBT configuration 200 may include four zones. Each of the zones may be configured for a different switching loss characteristic as well as a different turn-off characteristic. A first zone 202 may be comprised of a plurality of first IGBT sections 210. The first IGBT sections 210 may be configured for a particular switching loss characteristic (e.g., point A 90). A second zone 204 may be comprised of a plurality of second IGBT sections 212. The second IGBT sections 212 may be configured for a switching loss characteristic that is different than that of the first IGBT sections 210 (e.g., point B 92). A third section 206 may be configured to be same as the first section 202. A fourth section 208 may be configured to be the same as the second section 204. Note that the first IGBT sections 210 and the second IGBT sections 212 may have similar structure to the previously described IGBT section 98. However, various characteristics of the various regions may be modified as described herein to achieve the desired switching characteristic for each of the zones. The third zone 206 and the fourth zone 208 may also be configured to have different performance characteristics.

FIG. 5 describes a second IGBT configuration 250 that includes four zones arranged in a grid. An upper left zone 252 may be configured for a particular switching loss characteristic (e.g., point A 90). A lower left zone 254 may be configured for a switching loss characteristic (e.g., point B 92) that is different than that of the upper left zone 252. An upper right zone 256 may be configured to have the same performance characteristics as the lower left zone 254. A lower right zone 258 may be configured to have the same performance characteristics as the upper left zone 252.

FIG. 6 depicts a third IGBT configuration 300 having a common gate conductor 302. The common gate conductor 302 is electrically connected to the gate region of each of the zones that comprise the IGBT. As described, each of the zones may transition to the non-conducting state at a different time depending on the switching loss characteristic of the zone. The common gate conductor 302 may provide the gate voltage to the gate of the IGBT. The common gate conductor 302 may carry a voltage or signal that controls the state of the IGBT.

The voltage or signal may be a request to transition to the non-conducting state (e.g., voltage falls below the gate threshold) or a request to transition to the conducting state (e.g., voltage rises above the gate threshold). The voltage or signal may be a request to maintain the present conducting or non-conducting state (e.g., no change in the gate voltage).

FIG. 7 depicts fourth IGBT configuration 350 wherein each type of zone has a different gate conductor that is derived from an input gate conductor 352. The input gate conductor 352 may carry a voltage or signal for controlling the state of the IGBT. Zones having low switching losses (e.g. zones labeled A) may be controlled by a first gate conductor 356. Zones having higher switching losses (e.g., zones labeled B) may be controlled by a second gate conductor 358. A delay block 354 may generate a voltage on the first gate conductor 356 and a voltage on the second gate conductor 358 based on the voltage or signal from the input gate conductor 352. As an example, the delay block 354 may include a resistive element between the input gate conductor 352 and the first gate conductor 356 to modify the turn-off timing of the associated gate regions. The zones may be configured such that zones having high switching losses receive a request to transition to the non-conducting state before the zones having low switching losses.

Figure 8:
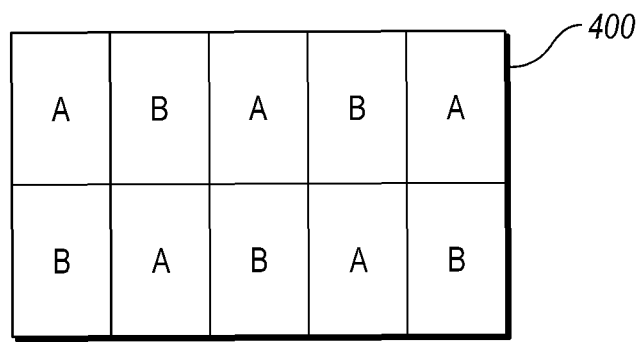
FIG. 8 depicts a possible IGBT configuration utilizing ten zones utilizing two distinct zone configurations arranged in a grid.

FIG. 8 depicts a fifth IGBT configuration 400 comprising ten zones arranged in a grid of two rows and five columns. The IGBT configuration 400 may be made up of two distinct zone configurations, A and B. For example, zones labeled A may have relatively low switching losses while zones labeled B may have relatively high switching losses.

Figure 9:
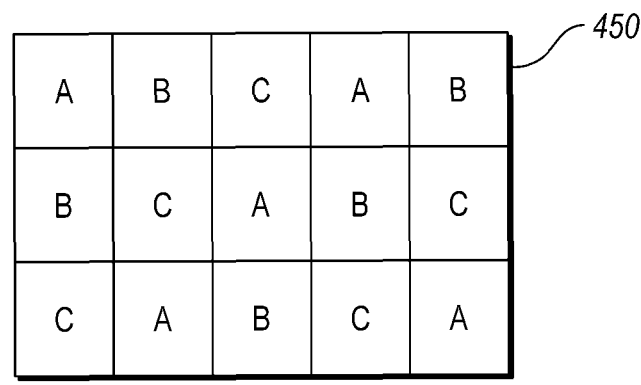
FIG. 9 depicts a possible IGBT configuration utilizing three distinct zone configurations arranged in a grid.

FIG. 9 depicts a sixth IGBT configuration 450 comprising fifteen zones arranged in a grid of three rows and five columns. The IGBT configuration 450 may be made up of three distinct zone configurations, A, B and C. For example, zones labeled A may have relatively low switching losses. Zones labeled B may have relatively high switching losses. Zones labeled C may have switching losses between those of A and B regions.

The different characteristic zones may be realized in number of ways. The high switching loss zones may be realized by increasing the doping density of the collector region 102 relative to the low switching loss zones. The higher switching loss zones may be configured to receive an earlier gate turn-off signal than the low switching loss zones. The high switching loss zones may have less gate resistance than low switching loss zones. The high switching loss zones may have a greater gate threshold voltage than the low switching loss zones. The high switching loss zones may have a thicker gate insulation layer 116 than the low switching loss zones. The high switching loss zone may have a higher doping density in the base region 108 than the low switching loss zones. The low switching loss zones may have less stored charges in the drift region 106 and/or the buffer region 104 than the high switching loss zones due to heavier treatment of recombination lifetime killing processes.

Although several exemplary configurations have been depicted, there are no limitations on the number of possible configurations. Any number of zones having different switching loss/turn-off timing may be applied and other arrangements are possible. Further, the arrangement of the zones within the device may be arranged to optimize thermal characteristics of the device. In addition, other IGBT and power semiconductor device structures may benefit from the disclosed features. The methods and structures disclosed are applicable to power semiconductor devices formed of any variety of semiconductor materials, such as silicon and silicon carbide.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. An insulated gate bipolar transistor comprising:
   first and second zones each including a plurality of gate regions coupled to an emitter via an emitter region and a base region and coupled to a drift region that is disposed on a collector region, the first zone being configured to (i) have a switching loss greater than the second zone during transitions from a conducting state to a non-conducting state, and (ii) transition, responsive to a common gate signal, from the conducting state to the non-conducting state before the second zone.

2. The insulated gate bipolar transistor of claim 1 wherein the collector region of the first zone has a doping density that is greater than that of the second zone.

3. The insulated gate bipolar transistor of claim 1 wherein the drift region of the first zone has more stored charges during a conducting state than the drift region of the second zone due to different recombination lifetime killing treatment between the first zone and the second zone.

4. The insulated gate bipolar transistor of claim 1 wherein the gate regions are electrically connected to a common gate signal.

5. The insulated gate bipolar transistor of claim 1 wherein a gate insulation layer separates the gate regions from adjacent regions and a thickness of the gate insulation layer of the first zone is greater than that of the second zone.

6. The insulated gate bipolar transistor of claim 1 wherein the base region of the first zone has a doping density that is greater than that of the second zone.

7. The insulated gate bipolar transistor of claim 1 wherein the first zone and the second zone are further configured such that the first zone receives a request to transition to the non-conducting state before the second zone receives the request.

8. The insulated gate bipolar transistor of claim 1 wherein the gate regions of the second zone are connected to a gate signal having a predetermined resistance value that lowers a discharging current level from gate capacitance of the second zone, and wherein the predetermined resistance value is greater than a resistance value associated with gate regions of the first zone.

9. A power semiconductor device comprising:
a plurality of zones configured such that at least two of the zones have different switching losses during transitions from a conducting state to a non-conducting state and such that, for any two of the zones, the zone of the two having a greater switching loss transitions, responsive to a common gate signal, from the conducting state to the non-conducting state before the other of the two.

10. The power semiconductor device of claim 9 wherein the at least two of the zones have different doping densities in at least one predetermined layer.

11. The power semiconductor device of claim 10 wherein the at least one predetermined layer is a collector region.

12. The power semiconductor device of claim 9 wherein the at least two of the zones have different thickness in at least one predetermined layer.

13. The power semiconductor device of claim 12 wherein the at least one predetermined layer is a gate insulation layer between a gate region and a base region.

14. The power semiconductor device of claim 9 wherein the at least two of the zones are further configured such that the zone of the two having the greater switching loss receives a request to transition to the non-conducting state before the other of the two.

15. An insulated gate bipolar transistor comprising:
a plurality of zones, each characterized by a switching loss during a transition from a conducting state to a non-conducting state, configured such that the switching loss is different between at least two of the zones and such that the zones having greater switching losses transition responsive to a common gate signal, from the conducting state to the non-conducting state before the zones having lesser switching losses.

16. The insulated gate bipolar transistor of claim 15 wherein the at least two of the zones have different doping densities in at least one region.

17. The insulated gate bipolar transistor of claim 16 wherein the at least one region is a collector region.

18. The insulated gate bipolar transistor of claim 15 wherein the at least two of the zones have different thickness in at least one region.

19. The insulated gate bipolar transistor of claim 18 wherein the at least one region is a gate insulation layer.

20. The insulated gate bipolar transistor of claim 15 wherein the at least two of the zones are further configured such that the zones having lower switching losses receive a request to transition to the non-conducting state after the zones having greater switching losses.

* * * * *